US012018365B2

(12) United States Patent
Raisanen et al.

(10) Patent No.: US 12,018,365 B2
(45) Date of Patent: Jun. 25, 2024

(54) SEMICONDUCTOR PROCESSING APPARATUS AND A METHOD FOR PROCESSING A SUBSTRATE

(71) Applicant: ASM IP Holding B.V., Almere (NL)

(72) Inventors: Petri Raisanen, Gilbert, AZ (US); David Marquardt, Scottsdale (AZ); Thomas Aswad, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/947,230

(22) Filed: Sep. 19, 2022

(65) Prior Publication Data

US 2023/0017569 A1   Jan. 19, 2023

Related U.S. Application Data

(62) Division of application No. 15/909,705, filed on Mar. 1, 2018, now Pat. No. 11,473,195.

(51) Int. Cl.
| | |
|---|---|
| *C23C 16/44* | (2006.01) |
| *C23C 16/455* | (2006.01) |
| *C23C 16/458* | (2006.01) |
| *C23C 16/46* | (2006.01) |
| *C23C 16/56* | (2006.01) |

(52) U.S. Cl.
CPC ...... *C23C 16/4407* (2013.01); *C23C 16/4404* (2013.01); *C23C 16/4405* (2013.01); *C23C 16/45565* (2013.01); *C23C 16/4581* (2013.01); *C23C 16/46* (2013.01); *C23C 16/56* (2013.01)

(58) Field of Classification Search
None
See application file for complete search history.

(56) References Cited

U.S. PATENT DOCUMENTS

| | | | |
|---|---|---|---|
| 2013/0129577 A1* | 5/2013 | Halpin | C23C 16/4409 |
| | | | 422/236 |
| 2014/0000843 A1* | 1/2014 | Dunn | H01L 21/67109 |
| | | | 165/80.5 |
| 2014/0265090 A1 | 9/2014 | Hou | |
| 2015/0004798 A1 | 1/2015 | Chandrasekharan et al. | |

FOREIGN PATENT DOCUMENTS

| | | | |
|---|---|---|---|
| JP | 2010114175 A | | 5/2010 |
| KR | 20120121324 A | | 11/2012 |
| KR | 20150049180 A | | 5/2015 |

* cited by examiner

*Primary Examiner* — Jeffrie R Lund
*Assistant Examiner* — Tiffany Z Nuckols
(74) *Attorney, Agent, or Firm* — Snell & Wilmer L.L.P.

(57) ABSTRACT

A semiconductor processing apparatus is disclosed. The apparatus may include, a reaction chamber and a susceptor dispose in the reaction chamber configured for supporting a substrate thereon, the susceptor comprising a plurality of through-holes in an axial direction of the susceptor. The apparatus may also include, a plurality of lift pins, each of the lift pins being disposed within a respective through-hole, and at least one gas transmitting channel comprising one or more gas channel outlets, the one or more gas channel outlets being disposed proximate to the through-holes. Methods for processing a substrate within a reaction chamber are also disclosed.

16 Claims, 5 Drawing Sheets

SEMICONDUCTOR PROCESSING APPARATUS AND A METHOD FOR PROCESSING A SUBSTRATE

CROSS-REFERENCE TO RELATED APPLICATIONS

This application is a Divisional of, and claims priority to and the benefit of, U.S. patent application Ser. No. 15/909,705, filed Mar. 1, 2018 and entitled "SEMICONDUCTOR PROCESSING APPARATUS AND A METHOD FOR PROCESSING A SUBSTRATE," which is hereby incorporated by reference herein.

FIELD OF INVENTION

The present disclosure relates generally to a semiconductor processing apparatus and particularly a semiconductor processing apparatus comprising a mechanism for preventing contamination of a substrate supported by a susceptor. The disclosure also generally relates to methods for processing a substrate and particularly methods for preventing contamination of a substrate during a processing phase.

BACKGROUND OF THE DISCLOSURE

Reaction chambers may be used for depositing various material layers onto semiconductor substrates. A semiconductor substrate, such as, for example, a silicon substrate, may be placed on a susceptor inside a reaction chamber. Both the substrate and the susceptor may be heated to a desired substrate temperature set point. In an example substrate treatment process, one or more reactant gases may be passed over a heated substrate, causing the deposition of a thin film of material on the substrate surface. Throughout subsequent deposition, doping, lithography, etch, and other processes, these layers are made into integrated circuits.

Reaction chambers are generally manufactured with a single chamber or a dual chamber. In a dual chamber arrangement, the two chambers may be oriented with one chamber vertically above the second chamber. The upper chamber may be utilized for processing of the substrate, while the lower chamber may be utilized for the loading and unloading of substrates into and out of the semiconductor processing apparatus. During operation of the semiconductor processing apparatus comprising dual chambers, undesirable contaminants may accumulate and/or coat the lower chamber which may result in unwanted downtime due to chamber cleaning and/or unwanted contamination of a substrate disposed in the upper chamber. Apparatus and methods are therefore desirable for preventing contamination of a substrate disposed in the upper chamber thereby resulting in improved semiconductor processing protocols.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, a semiconductor processing apparatus is provided. The apparatus may comprise: a reaction chamber, a susceptor disposed within the reaction chamber and configured for supporting a substrate thereon, the susceptor comprising a plurality of through-holes in an axial direction of the susceptor. The apparatus may also comprise; a plurality of lift pins, each of the lift pins being disposed within a respective though-hole; and at least one gas transmitting channel comprising one or more gas channel outlets, the one or more gas channel outlets being disposed proximate to the though-holes.

In some embodiments, methods for processing a substrate may be provided. The method may comprise: providing a reaction chamber, and providing a susceptor disposed within the reaction chamber configured for supporting a substrate thereon, the susceptor comprising a plurality of through-holes in an axial direction of the susceptor. The method may also comprise; providing a plurality of lift pins, each of the lift pins being disposed in a respective through-hole, and providing at least one gas transmitting channel comprising one or more gas channel outlets, the one or more gas channel outlets being disposed proximate to the through-holes. The method may also comprise; flowing a gas through the at least one gas transmitting channel, the gas exiting the gas transmitting channel through the one or more gas channel outlets.

For the purpose of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, apparatus, structure, or device, but are merely idealized representations that are used to describe embodiments of the disclosure.

As used herein, the term "substrate" may refer to any underlying material or materials that may be used, or upon which, a device, a circuit or a film may be formed.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

As used herein, the term "contaminant" may refer to any unwanted material disposed within the reaction chamber that may affect the purity of a substrate disposed in the reaction chamber. The term "contaminant" may refer to, but is not limited to, unwanted deposits, metal and non-metal particles, impurities, and waste products, disposed within the reaction chamber.

The embodiments of the disclosure may include semiconductor processing apparatus and methods that may be utilized for processing a substrate within a semiconductor processing apparatus. The semiconductor processing apparatus may comprise a dual chamber module, wherein an upper chamber is configured for processing one or more substrates, and a lower chamber is configured for the loading and unloading of one or more substrates into and out of the semiconductor processing apparatus.

In some embodiments of the disclosure, the upper chamber and the lower chamber may be substantially isolated from one another utilizing one or more sealing members. The sealing of the upper chamber from the lower chamber may be desirable to prevent precursor gases, utilized in the processing of the substrate, from contacting the lower chamber of the apparatus. For example, the precursor gases utilized for processing substrates in the upper chamber may comprise, corrosive deposition precursors which may contact the lower chamber producing unwanted deposits/contaminants/particles which may in turn be reintroduced into the upper chamber thereby providing a source of contamination to a substrate disposed in the upper chamber.

In some embodiments, a first sealing member may be positioned on a perimeter of a susceptor disposed within the upper chamber, and a second sealing member may be positioned between the upper chamber and the lower chamber, wherein the first and second sealing members are selectively engaged with one another to limit the communication between the upper chamber and the lower chamber. Although the sealing members may substantially prevent fluid communication between the upper chamber and the lower chamber, it may still be possible for a small volume of precursor gases to enter the lower chamber by diffusion through the sealing members, resulting in possible corrosion, unwanted deposition and contaminants, in the lower chamber of the reaction chamber of the semiconductor processing apparatus.

In addition to the sealing members substantially preventing fluid communication between the upper chamber and the lower chamber, process parameters may also be utilized to reduce unwanted precursor gases from contacting the lower chamber of the semiconductor processing apparatus. For example, in some embodiments, a purge, an inert, or other gas flow within the lower chamber may be provided at a pressure which is greater than the gas flow pressure in the upper chamber, thereby substantially preventing the flow of precursor gas in the upper chamber from diffusing through to the lower chamber.

The transfer of a substrate between the lower chamber and the upper chamber may be achieved through the use of lift pins. For example, a susceptor, upon which the substrate may be disposed during processing, may include a plurality of through-holes. Each through-hole may have an associated lift pin which can traverse in the vertical plane between the lower chamber and the upper chamber. For example, in some embodiments, the semiconductor processing apparatus may comprise a susceptor including three through-holes with a corresponding three lift pins which may move in unison up and down in the vertical plane to raise and lower a substrate between the lower chamber and the upper chamber. Although the through-holes are desirable for accommodating the lift pins and facilitating substrate transfer, the through-holes may also represent an unwanted fluid communication path between the upper chamber and the lower chamber. For example, any unwanted contaminants disposed within the lower chamber may accumulate in the through-holes which may result in backside contamination of a substrate supported by the susceptor. The contamination process may be further exacerbated by the increased pressure commonly present in the lower chamber compared with the upper chamber which may drive contaminants upwards, wherein the contaminants may transverse through the through-holes and contaminate the upper chamber and also the backside of a substrate supported by the susceptor.

Therefore, apparatus and methods are desirable for preventing contaminants present in the lower chamber from crossing through the plurality of through-holes present in the susceptor and subsequently contaminating the upper chamber and particularly contaminating the backside of the substrate supported by the susceptor. To address these contamination issues, the embodiments of the disclosure include systems and methods for providing a purge gas proximate to the plurality of through-holes, the purge gas providing a protective gas curtain that substantially prevents contaminants from accumulating in and around the plurality of through-holes and substantially prevents any unwanted contaminants from traversing through the plurality of through-holes and contacting the upper chamber and particular the backside of a substrate. The embodiments of the disclosure therefore provide a gas transmitting channel comprising one or more gas outlets which are disposed proximate to the through-holes and their associated lift-pins. A purge gas may flow through the one or more gas transmitting channels and exit at the one or more gas outlets proximate to the through-holes, thereby substantially preventing contamination issues in the upper chamber and particular contamination of the backside of a substrate supported by the susceptor.

Therefore, the embodiments of the disclosure may provide a semiconductor processing apparatus comprising: a reaction chamber, a susceptor disposed in the reaction configured for supporting a substrate thereon, the susceptor comprising a plurality of through-holes in an axial direction of the susceptor. The apparatus may also include; a plurality of lift-pins, each of the lift-pins being disposed in a respective through-hole; and at least one gas transmitting channel comprising one or more gas channel outlets, the one or more gas channel outlets being disposed proximate to the through-holes.

Figure 1:
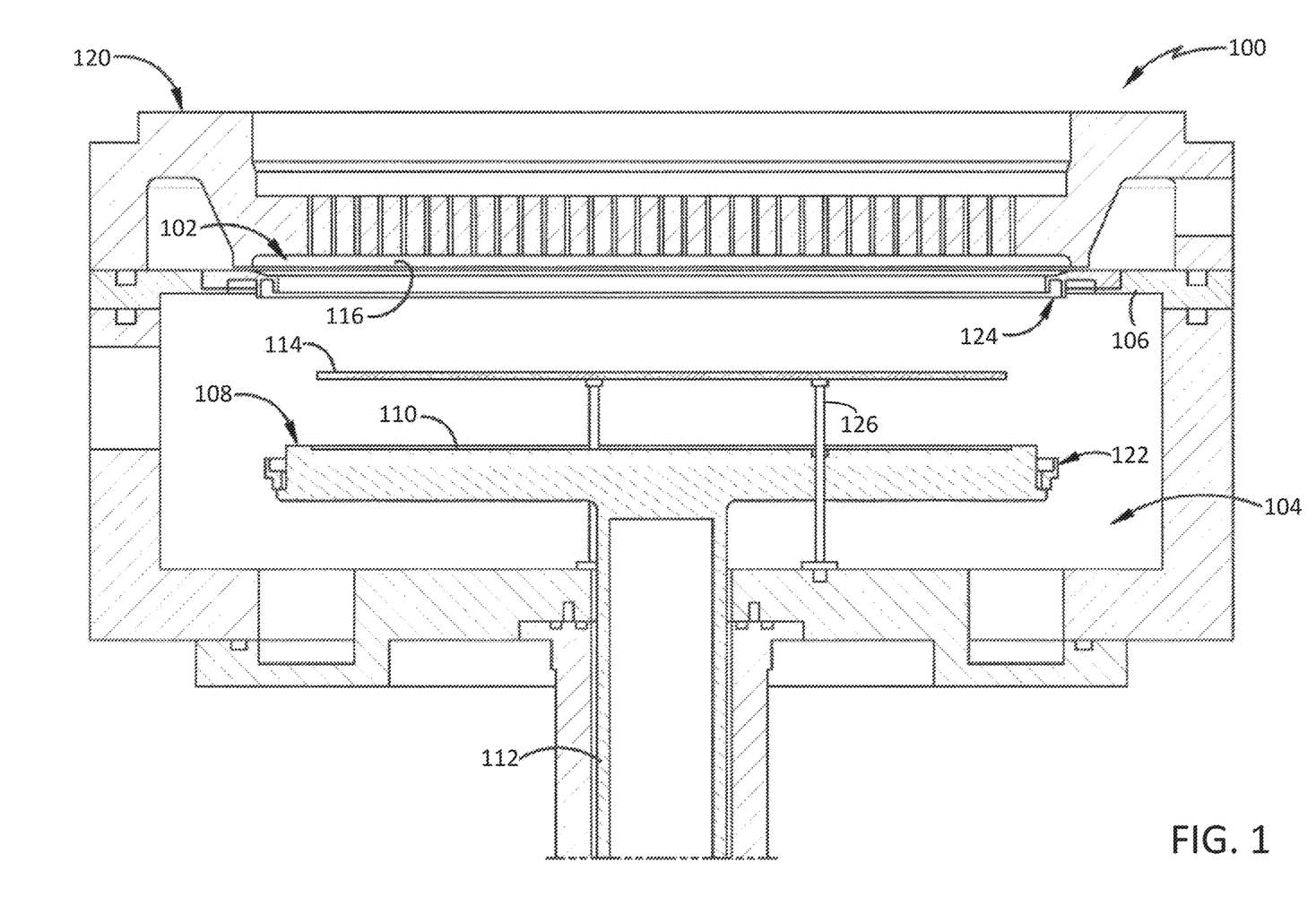
FIG. 1 is a schematic diagram of an exemplary reaction chamber comprising an upper chamber and a lower chamber, the reaction chamber configured in the substrate loading position.
Figure 2:
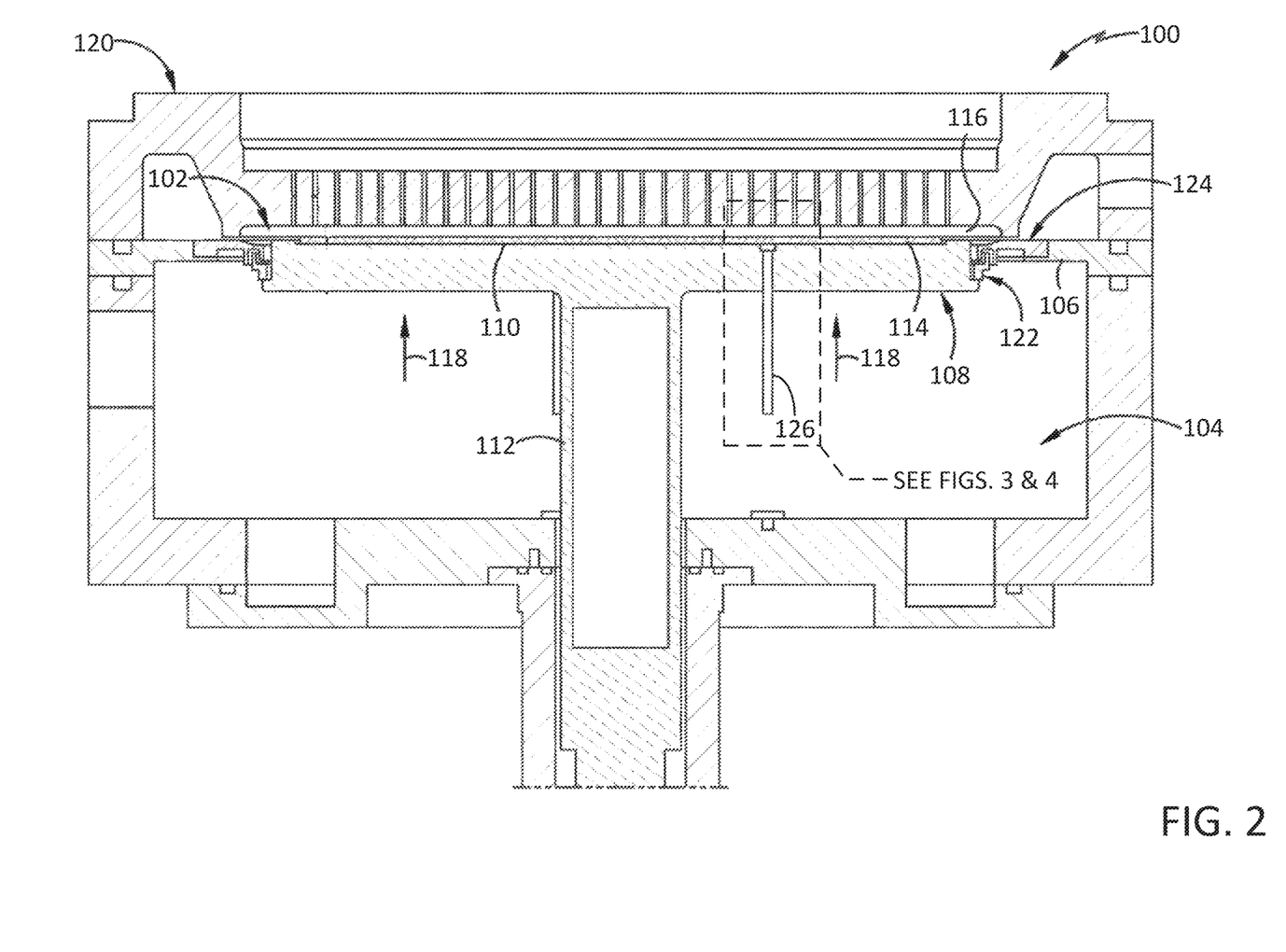
FIG. 2 is a schematic diagram of an exemplary reaction chamber comprising an upper chamber and a lower chamber, the reaction chamber configured in the substrate processing position.

The embodiments of the disclosure may be illustrated with reference to FIG. 1 and FIG. 2, which illustrate an exemplary reaction chamber 100 that may incorporate the embodiments of the disclosure. In some embodiments of the disclosure, the reaction chamber 100 may be configured for performing atomic layer deposition processes, whereas in other embodiments the reaction chamber 100 may be configured for performing chemical vapor deposition processes. In more detail, FIGS. 1 and 2 illustrate cross-sectional views of a reaction chamber 100 in a loading/unloading position (FIG. 1) and in a processing position (FIG. 2). Reaction chamber 100 may include an upper chamber 102 and a lower chamber 104, which may be separated by an interface plate 106. In general, processing occurs within the upper chamber 102, while substrate loading and unloading occurs within the lower chamber 104. A susceptor 108 includes a substrate mounting surface 110 and is connected to a vertically moveable elevator 112 for displacing the susceptor between the substrate loading position and the substrate processing position. A substrate 114 may be positioned on substrate mounting surface 110 and may be located in a processing region 116 when susceptor 108 is moved upwards in the direction of arrows 118 as shown in FIG. 2 with a showerhead 120 defining an upper surface of the processing region. In some embodiments of the disclosure, a first sealing member 122 may be positioned on and removable from susceptor 108, while a second sealing member 124 may be positioned between upper chamber 102 and the lower chamber 104. In some embodiments, the second sealing member 124 may be positioned to rest at least partially on the interface plate 106 or may be connected to the interface plate or any other suitable portion of the reaction chamber 100. The reaction chamber 100 may also comprise a plurality of lift pins, such as exemplary lift pin 126, the lift pin 126, and associated features are shown in more specific detail in the enlarged view of a portion of reaction chamber 100 as illustrated in FIG. 3 and FIG. 4, which illustrate exemplary embodiments of the lift pin purge apparatus of the current disclosure.

Figure 3:
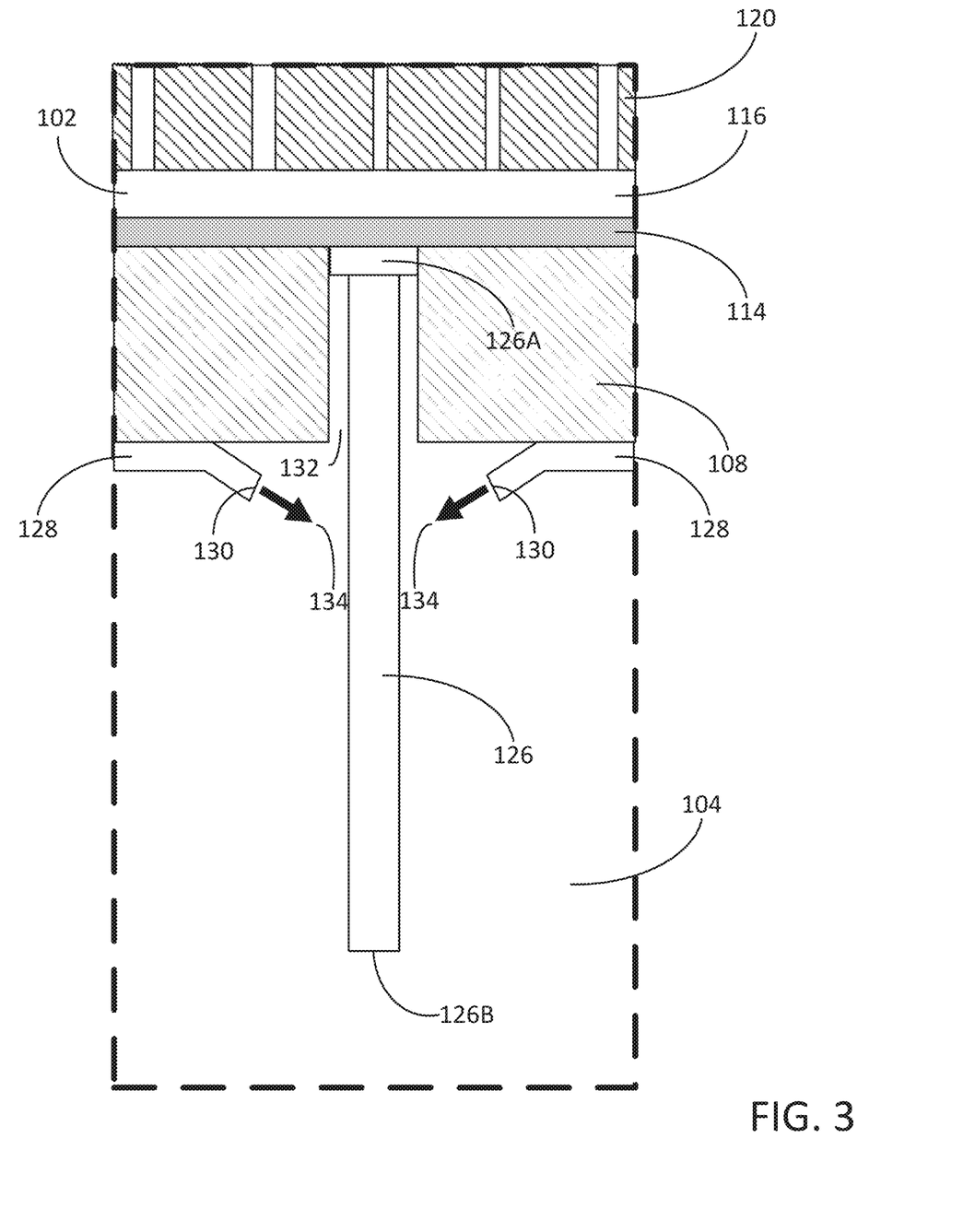
FIG. 3 is a schematic exploded view of an exemplary reaction chamber illustrating a lift pin purge mechanism according the embodiments of the disclosure.
Figure 4:
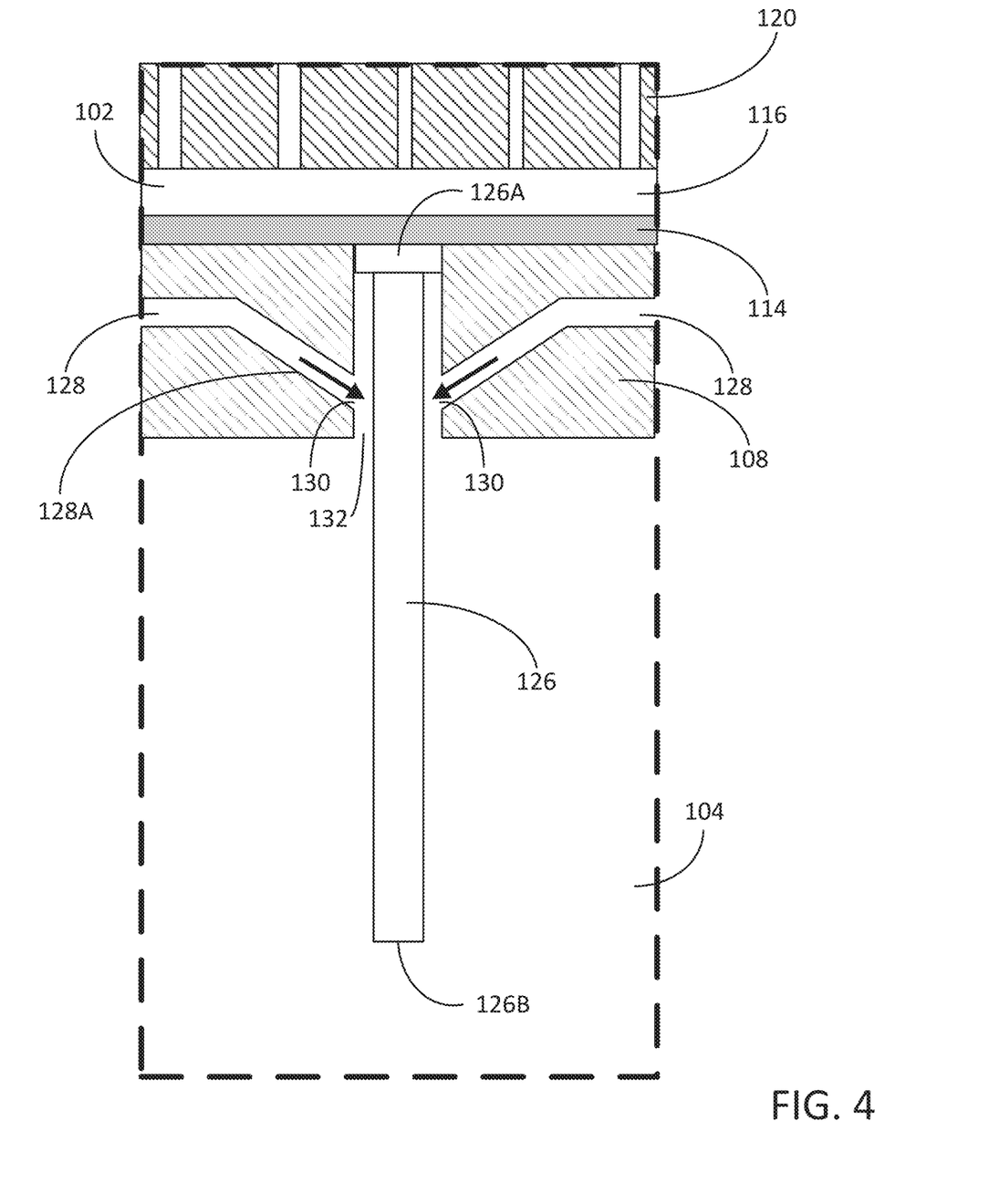
FIG. 4 is a schematic exploded view of an exemplary reaction chamber illustrating an additional lift pin purge mechanism according to the embodiments of the disclosure.

FIG. 3 illustrates an expanded view of an exemplary lift pin purge mechanism according to the embodiments of the disclosure. In some embodiments of the disclosure, the lift pin 126 comprising a lift pin head 126A and a lift pin base 126B, the lift pin 126 being disposed in through-hole 132, the through-hole being disposed in a susceptor 108 in an axial direction. Disposed above the susceptor 108 and in contact with the pin lift head 126A is a substrate 114, the substrate 114 being positioned in the processing position. Disposed directly above the substrate 114 is the processing region 116 in the upper chamber 102, the upper extent of the processing region 116 being defined by the lower surface of the showerhead 120. The exemplary lift pin purge mechanism of FIG. 3 may also comprise at least one gas transmitting channel 128 which may be configured for a flowing a gas, such as a purge gas, into the lower chamber 104. In some embodiments, the at least one gas transmitting channel 128 may be fluidly connected, via appropriate gas lines, valving, mass flow controllers, etc., to one or more vessels containing a source of gas, such as a purge gas. In some embodiments of the disclosure, the at least one gas transmitting channel 128 may be disposed beneath the susceptor 108. For example, the at least one gas transmitting channel 128 may be disposed directly beneath the susceptor 108 and may also be supported by the susceptor 108. As illustrated by the non-limiting example embodiment of FIG. 3, two gas transmitting channels 128 may be associated with each lift pin 126, however, it should be noted that any number of gas transmitting channels may be associated with each of the plurality of the lift pins in the reaction chamber 100. For example, each of the plurality of lift pins 126 may be associated with one or more, two or more, three or more, four or more, or even five more gas transmitting channels.

In some embodiments of the disclosure, the at least one gas transmitting channel may comprise one or more gas channel outlets, the gas channel outlets 130 configured for dispensing a purge gas into the lower chamber 104 of reaction chamber 100. In some embodiments of the disclosure, the one or more gas channel outlets 130 are disposed proximate to the through-holes 132. For example, each of the plurality of lift pins 126 may have a least one gas channel outlet associated with it, the at least one gas channel outlet 130 being disposed proximate to an associated lift pin. In some embodiments, the at least one gas channel outlet 130 may be disposed at a distance from an associated through-hole 132 at a distance of less than 10 millimeters, or less than 5 millimeters, or even less than 1 millimeter.

In some embodiments of the disclosure, the one or more gas channel outlets 130 are configured to direct a gas towards the lift pins. In other word, each of the plurality of lift pins has at least one gas channel outlet associated with it, the gas channel outlet being disposed both proximate to the through-hole and the lift-pin. The at least one gas channel outlet 130 may be configured to direct a gas, i.e., a purge gas, towards an associated lift pin. For example, and with reference to FIG. 3, the gas transmitting channel channels 128 comprise gas channel outlets 130 which are configured to direct a gas (as denoted by arrows 134) in a direction toward the associated lift pin 126.

In some embodiments of the disclosure, the plurality of lift pins each comprise an upper lift pin head 126A and a lower lift pin base 126B and the one or more gas channel outlets 130 may be configured to direct a gas towards each of the lift pin bases 126B, i.e., the gas channel outlets are configured to direct a gas along a protection declined toward the lower lift pin base 126B.

In some embodiments of the disclosure, at least one gas channel outlet 130 may be associated with each lift pin 136, and the at least one gas channel outlet 130 may be configured to direct a gas down the length of the associated lift pin 126.

In some embodiments of the disclosure, the reaction chamber 100 (FIGS. 1 and 2) comprises an upper chamber 102 and a lower chamber 104 and the one or more gas channels outlets 130 are configured to direct a gas towards the lower chamber 104, i.e., the gas channel outlets are declined toward the lower chamber 104 in order to dispense a purge gas towards the lower chamber 104. In some embodiments, the gas transmitting channel 128 may include at least a portion of a gas transmitting channel that may be declined in a downwards direction towards the lower chamber 104 to thereby enable the dispensing of a purge gas out of the gas channel outlet 130 towards the lower chamber 104. The arrangement of one or both of the gas transmitting channels 128 and the gas channel outlets 130 in a declined direction towards the lower chamber may prevent any contaminants present in the lower chamber from traversing upwards though the plurality of through-holes to the upper chamber 102.

In some embodiments of the disclosure, and as illustrated in FIG. 3, each lift pin 126 may be associated with two or more gas transmitting channels 128, each gas transmitting channel 128 comprising a gas channel outlet 130 configured for directing a gas towards the lift pin 126. In some embodiments, each lift pin is associated with two or more gas transmitting channels 128, each gas transmitting channel 128 comprising a gas channel outlet 130, each gas channel outlet being at a declined angle towards the lift pin base 126B to direct a gas downward along the length of the lift pin 126.

FIG. 4 illustrates an expanded view of an additional exemplary lift pin purge mechanism according to the embodiments of the disclosure. The lift pin purge mechanism of FIG. 4 has many features similar to those described and illustrated in FIG. 3, therefore, for conciseness, only the differential features of the additional embodiment are described.

As illustrated in FIG. 4, the susceptor 108 comprises a though-hole 132 with an associated lift pin 126 disposed therein. However, also disposed within the susceptor is at least one gas transmitting channel 128, each gas transmitting channel 128 comprising at least one gas channel outlet 130. Therefore, the one or more gas transmitting channels 128 and their associated gas channel outlets 130 are integral to the susceptor 108, i.e., the one or more gas transmitting channels 128 being internal to the susceptor 108. The integration of the one or more gas transmitting channels 128 within the susceptor 108 may allow for the gas transmitting channels and their associated gas channel outlets to be more proximate to the lift pin head 126A allowing for a purge gas to be directed down the length of the through-hole 132 and into the lower chamber 104. The ability to direct a purge gas directly downward through the through-holes may substantially prevent any contaminants present in the lower chamber from traversing upward through the through-hole 132 to the upper chamber 102. In some embodiments of the disclosure, the one or more integrated gas transmitting channels 128 may be fluidly connect, via appropriate gas lines, valving, mass flow controllers, etc., to one or more vessels containing a source of gas, such as a purge gas.

In some embodiments of the disclosure, the one or more gas transmitting channels 128 integrated into the susceptor 108 may include at least a portion of a gas transmitting channel which is declined toward the lower chamber. For example, the gas transmitting channels 128 as illustrated in FIG. 4, may include a portion of a gas transmitting channel 128A which is declined toward the lower chamber 104 such that a purge gas exiting from the gas channel outlet 130 is directed downward along the both the length of the through-hole 132 and the along length of the lift pin 126.

The embodiments of the disclosure may also include methods for processing a substrate. The methods of the disclosure may comprise: providing a reaction chamber, providing a susceptor disposed within the reaction chamber configured for supporting a substrate thereon, the susceptor comprising a plurality of through-holes in an axial direction of the susceptor. The method may also comprise; providing a plurality of lift pins, each of the lift pins being disposed in a respective through-hole; and providing at least one gas transmitting channel comprising one or more gas channel outlets, the one or more gas channel outlets being disposed proximate to the though-holes. The method may also comprise; flowing a gas through the at least one gas transmitting channel, the gas exiting the gas transmitting channel through the one or more gas channel outlets.

Figure 5:
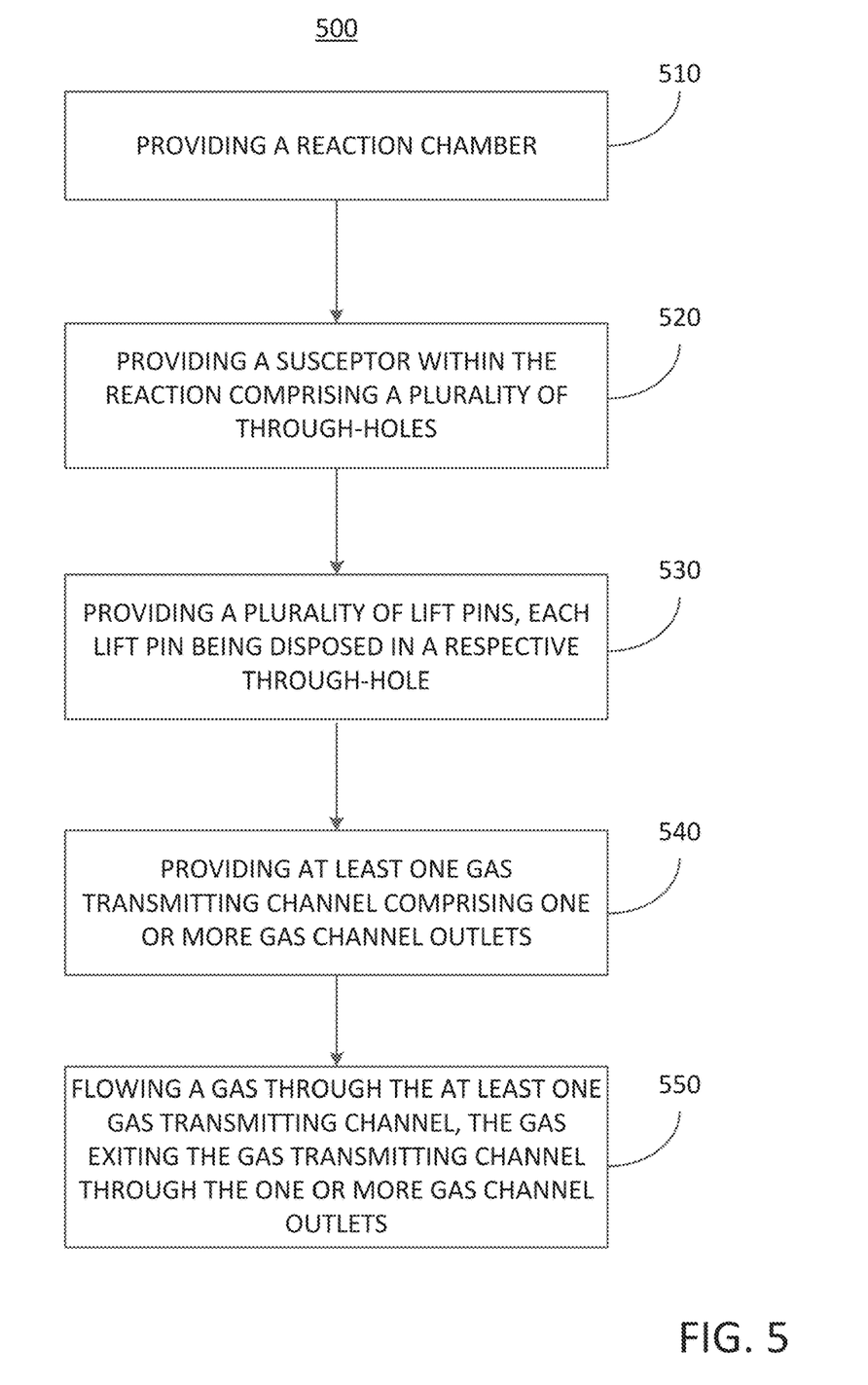
FIG. 5 illustrates a process flow for processing a substrate within a reaction chamber according to exemplary the embodiments of the disclosure.

The embodiments of the disclosure may be illustrated by the process flow illustrated in FIG. 5, which comprises a method 500 for processing a substrate within a reaction chamber according to exemplary embodiments of the disclosure.

In more detail, the method 500 may proceed with a process block 510 comprising providing a reaction chamber. In some embodiments, the reaction chamber may be configured for atomic layer deposition processes, whereas in alternative embodiments, the reaction chamber may be configured for chemical vapor deposition processes. It should also be appreciated that the embodiments of the disclosure may be utilized in a reaction chamber configured for a multitude of deposition processes, including but not limited to, metalorganic chemical vapor deposition (MOCVD), molecular beam epitaxy (MBE), and physical vapor deposition (PVD). The embodiments of the disclosure may also be utilized in reaction chambers configured for processing a substrate with a reactive precursor, which may also include etch processes, such as, for example, reactive ion etching (RIE), inductively coupled plasma etching (ICP), and electron cyclotron resonance etching (ECR). In some embodiments, the reaction chamber may comprise a dual chamber comprising, an upper chamber configured for processing one or more substrates and a lower chamber configured for the loading and unloading of substrates from the reaction chamber.

The method 500 may continue with a process block 520 comprising providing a susceptor within the reaction chamber configured for supporting a substrate thereon, the susceptor comprising a plurality of through-holes in axial direction of the susceptor. In some embodiments, the susceptor may comprise at least three through-holes.

The method 500 may continue with a process block 530 comprising providing a plurality of lift pins, each of the lift pins being disposed in a respective through-hole. In some embodiments of the disclosure, the susceptor may include three lift pins disposed therein and configured for raising and lowering a substrate between an upper chamber and a lower chamber.

The method 500 may continue with a process block 540 comprising providing at least one gas transmitting channel comprising one or more gas channel outlets, the one or more gas channel outlets being disposed proximate to the through-holes. In some embodiments, the at least one gas transmitting channel may be disposed within the susceptor, i.e., the gas transmitting channels are integral to the susceptor. In some embodiments, the at least one gas transmitting channel may be disposed beneath the susceptor. For example, the one or more gas transmitting channels may be disposed directly beneath the susceptor whilst also being supported by the susceptor.

The method 500 may continue with a process block 550 comprising flowing a gas through the at least one gas transmitting channel, the gas exiting the gas transmitting channel through the one or more gas channel outlets. The one or more gas transmitting channels may be fluidly connected, via appropriate gas lines, valving, mass flow controllers, etc., to one or more vessels containing a source of gas, such as a purge gas. For example, the purge gas may comprise an inert gas, such as, without limitation, argon (Ar), nitrogen (N2), or helium (He). In some embodiments of the disclosure, the reaction chamber comprises an upper chamber and a lower chamber and the one or more gas channel outlets are configured to direct the gas towards the lower chamber, thereby preventing any contaminants present in the lower chamber from traversing upwards through the plurality of through-holes to the upper chamber. In some embodiments of the disclosure, the at least one gas transmitting channel comprises at least a portion of a gas transmitting channel which is declined towards the lower chamber such that a purge gas may be directed in a downwards direction towards an associated lift pin and into the lower chamber.

In some embodiments, a purge, an inert, or other gas flow within the lower chamber may be provided at a pressure which is greater than the gas flow pressure in the upper chamber, thereby substantially preventing the flow of precursor gas in the upper chamber from diffusing through to the lower chamber. In addition, in some embodiments, the gas exiting the at least one gas transmitting channel may provide a pressure greater than that exerted by the gas flow within the lower chamber, such that the gas flow from the at least one gas transmitting channel may substantially prevent any contaminants present in the lower chamber from traversing through the plurality of through-holes disposed within the susceptor.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

We claim:

1. A semiconductor processing apparatus, comprising:
a reaction chamber;
a susceptor disposed in the reaction chamber, the susceptor comprising a first surface disposed opposite a second surface, the second surface configured to support a substrate thereon, the susceptor comprising a body with a plurality of through-holes disposed in an axial direction;
a plurality of lift pins, each of the plurality of lift pins being disposed in a respective through-hole; and
two or more gas transmitting channels external to the body of the susceptor and adjacent to the second surface, each of the two or more gas transmitting channels comprising one or more gas channel outlets to direct a purge gas discharged from the one or more gas channel outlets along a portion of each of the plurality of lift pins, wherein each of the two or more gas transmitting channels is disposed at a declined angle away from the substrate configured to direct the purge gas through the one or more gas channel outlets downward, and each of the two or more gas transmitting channels being fluidly connected to one or more vessels containing a source of the purge gas.

2. The apparatus of claim 1, wherein the reaction chamber is configured for at least one of atomic layer deposition or chemical vapor deposition.

3. The apparatus of claim 1, wherein each of the two or more gas transmitting channels is disposed beneath the susceptor.

4. The apparatus of claim 1, wherein each of the one or more gas channel outlets are configured to direct the purge gas toward a bottom of a respective lift pin of the plurality of lift pins.

5. The apparatus of claim 1, wherein each of the plurality of lift pins comprises an upper lift pin head and a lower lift pin base, and wherein the one or more gas channel outlets are configured to direct the purge gas toward the lower lift pin base.

6. The apparatus of claim 1, wherein each lift pin is associated with at least two of the two or more gas transmitting channels, each of the two or more gas transmitting channels comprising a gas channel outlet configured for directing the purge gas toward the lift pin.

7. The apparatus of claim 1, wherein at least one gas channel outlet is associated with each lift pin, and wherein the at least one gas channel outlet is configured to direct the purge gas down a length of the lift pin.

8. The apparatus of claim 1, wherein at least one gas channel outlet is associated with each though-hole, wherein the at least one gas channel outlet is configured to direct the purge gas down into a lower chamber.

9. The apparatus of claim 1, wherein the reaction chamber comprises an upper chamber and a lower chamber, wherein the one or more gas channel outlets are configured to direct the purge gas towards the lower chamber, thereby preventing contaminants present in the lower chamber from traversing upwards through the plurality of through-holes to the upper chamber.

10. A semiconductor processing apparatus, comprising:
a reaction chamber;
a susceptor disposed in the reaction chamber, the susceptor comprising a first surface disposed opposite a second surface, the second surface configured to support a substrate thereon, the susceptor comprising a body with at least one through-hole through the susceptor;

at least one lift pin disposed in the at least one through-hole;

at least one gas transmitting channel adjacent to the first surface and external to the body of the susceptor; and two or more gas channel outlets in fluid communication with the at least one gas transmitting channel, each of the two or more gas channel outlets associated with, and disposed proximate an outlet of, the at least one through-hole, and each of the two or more gas channel outlets disposed at a declined angle and configured to direct a purge gas discharged from each of the two or more gas channel outlets away from the first surface.

11. The apparatus of claim 10, wherein each of the two or more gas channel outlets is configured to direct the purge gas downward along an axis along which the at least one lift pin spans.

12. The apparatus of claim 10, wherein the at least one gas transmitting channel is disposed beneath the susceptor.

13. The apparatus of claim 10, wherein each of the two or more gas channel outlets is configured to direct the purge gas toward a bottom of the at least one lift pin.

14. A reaction chamber, comprising:

a susceptor comprising a first surface disposed opposite a second surface, the second surface configured to support a substrate thereon, the susceptor comprising a body having a plurality of through-holes in an axial direction;

a plurality of lift pins each being disposed in a respective through-hole of the plurality of through-holes;

a plurality of gas transmitting channels, each of the plurality of gas transmitting channels coupled and external to the body of the susceptor; and a plurality of gas channel outlets in fluid communication with one or more of the plurality of gas transmitting channels, each of the plurality of through-holes associated with two or more of the plurality of gas channel outlets, each of the two or more of the plurality of gas channel outlets configured to direct a purge gas discharged from the respective gas channel outlet away from the first surface.

15. The reaction chamber of claim 14, wherein each of the plurality of lift pins comprise an upper lift pin head and a lower lift pin base, and wherein each of the two or more of the plurality of gas channel outlets is configured to direct the purge gas toward the lower lift pin base of the respective lift pin of the plurality of lift pins.

16. The reaction chamber of claim 14, further comprising an upper chamber and a lower chamber, wherein the each of the plurality of gas channel outlets is configured to direct the purge gas toward the lower chamber, thereby preventing contaminants present in the lower chamber from traversing upwards through the plurality of through-holes to the upper chamber.

* * * * *